(12) United States Patent
Kazuyoshi

(10) Patent No.: US 7,436,261 B2
(45) Date of Patent: Oct. 14, 2008

(54) OPERATIONAL AMPLIFIER

(75) Inventor: Sawada Kazuyoshi, Osaka (JP)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 41 days.

(21) Appl. No.: 11/723,864

(22) Filed: Mar. 22, 2007

(65) Prior Publication Data

US 2007/0252647 A1 Nov. 1, 2007

(30) Foreign Application Priority Data

Apr. 13, 2006 (JP) ............................. 2006-111092

(51) Int. Cl.
*H03F 3/45* (2006.01)
(52) U.S. Cl. .................... 330/253; 330/257; 330/252
(58) Field of Classification Search ............... 330/253, 330/257, 252
See application file for complete search history.

(56) References Cited

U.S. PATENT DOCUMENTS

| | | | | |
|---|---|---|---|---|
| 5,343,164 A * | 8/1994 | Holmdahl | .................. | 330/253 |
| 6,310,520 B1 * | 10/2001 | Walden | ..................... | 330/295 |
| 6,614,295 B2 * | 9/2003 | Tsuchi | ...................... | 327/563 |
| 7,068,103 B2 * | 6/2006 | Lind | ......................... | 330/251 |
| 7,265,593 B2 * | 9/2007 | Sung | ......................... | 327/112 |
| 7,345,542 B2 * | 3/2008 | Dashtestani et al. | ......... | 330/256 |

\* cited by examiner

*Primary Examiner*—Patricia Nguyen
(74) *Attorney, Agent, or Firm*—Morgan, Lewis & Bockius LLP (57) ABSTRACT

An operational amplifier includes: a differential amplifier circuit configured to receive an inverting input voltage (VIN−) and a non-inverting input voltage (VIN+); and an auxiliary circuit for improving a slew rate of an output voltage of the differential amplifier circuit, wherein when a voltage difference between the inverting input voltage (VIN−) and the non-inverting input voltage (VIN+) is less than a predetermined small voltage difference, an output terminal of the auxiliary circuit is disconnected from an output terminal of the differential amplifier circuit, and when the voltage difference exceeds the predetermined small voltage difference so that a voltage waveform is shifted to at least one direction, the voltage shift is accelerated by receiving/transferring a current from/to the output terminal of the differential amplifier circuit toward a shifting direction of an output voltage of the differential amplifier circuit.

9 Claims, 5 Drawing Sheets

ID2 represents a bias current
OPERATIONAL AMPLIFIER

CROSS-REFERENCE TO RELATED APPLICATIONS

The present invention claims priority of Japanese patent application number 2006-111092, filed on Apr. 13, 2006, which is incorporated by reference in its entirety.

BACKGROUND OF THE INVENTION

The present invention relates to an operational amplifier, and more particularly, to a high slew-rate operational amplifier that is most suitable for driving a capacitive load, e.g., a liquid crystal panel.

In operational amplifiers, one of which is disclosed in Japanese Laid-open Patent Publication No. HEI 07-263978, a slew rate defined as a maximum rate of change of an output voltage with respect to time is an important factor in driving capacitive loads, e.g., an active matrix liquid crystal panel.

Figure 7:
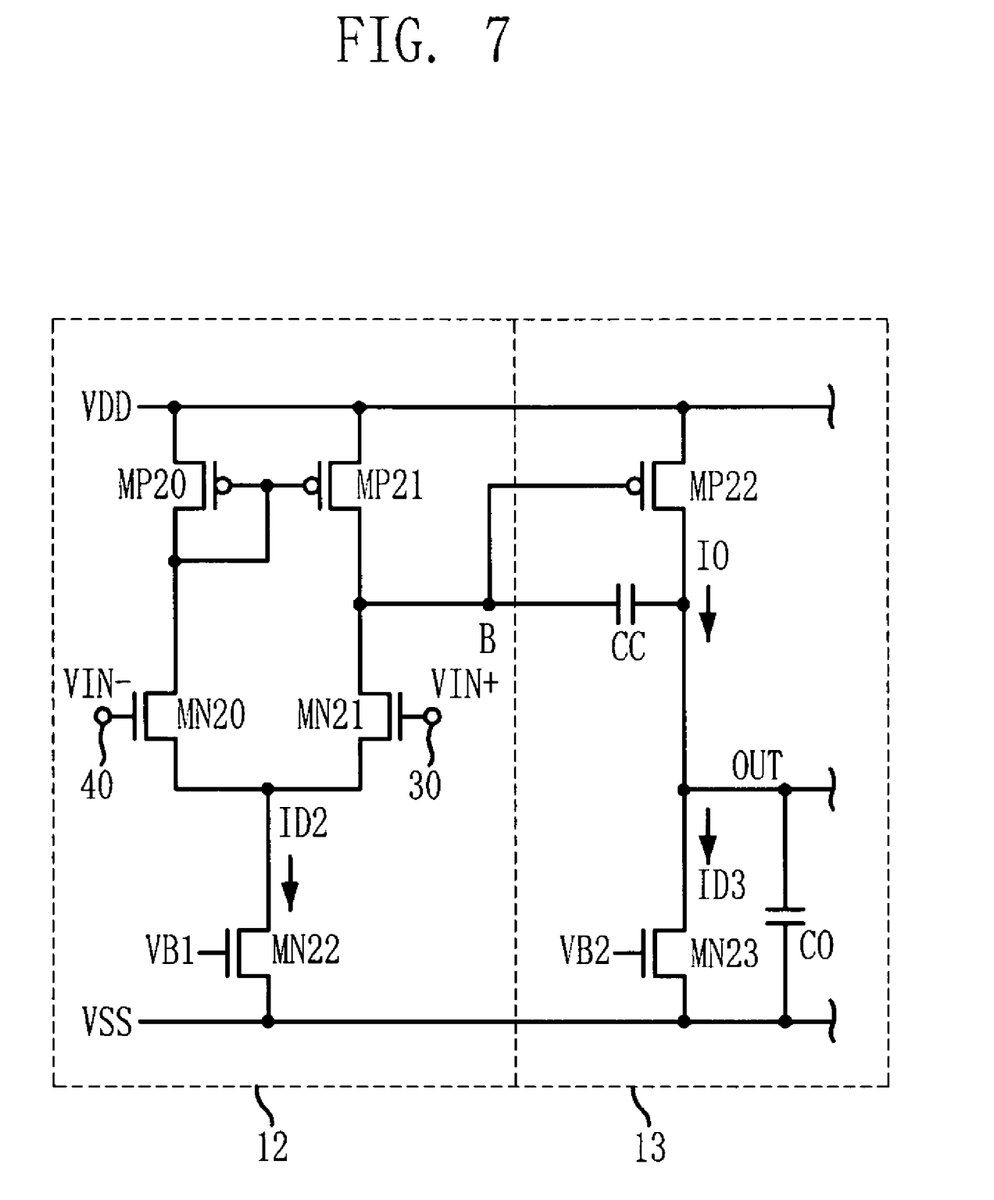
FIG. 7 is a circuit diagram of a conventional operational amplifier.

A conventional operational amplifier is shown in FIG. 7. In FIG. 7, reference symbols MP20 to MP22 represent PMOS transistors and reference symbols MN20 to MN23 represent NMOS transistors. The conventional operational amplifier includes a differential amplifier circuit 12 and an output circuit 13. The differential amplifier circuit 12 is implemented with transistors MP20, MP21, MN20, MN21 and MN22. Reference numerals 30 and 40 represent a non-inverting input terminal and an inverting input terminal, respectively. The output circuit 13 is implemented with transistors MP22 and MN23. An output node B of the differential amplifier circuit 12 is connected to a gate of the transistor MP22 of the output circuit 13 and is also connected through a phase compensation capacitor CC to an output terminal OUT of the output circuit 13. A load capacitor CO is connected between the output terminal OUT and a ground voltage VSS. The output terminal OUT is connected to the inverting input terminal 40, so that a voltage at the output terminal OUT is applied as an inverting input voltage VIN−. A non-inverting input voltage VIN+ is applied to the non-inverting input terminal 30.

In the differential amplifier circuit 12, the transistors MN20 and MN21 form an N-type differential transistor pair, and the transistors MP20 and MP21 form a current mirror acting as a load of the differential transistor pair. The transistor MN22 acts as a constant current source. The output circuit 13 is an inverter amplifier implemented with a common source transistor MP22 and a transistor MN23, which act as a driver transistor and a constant current load, respectively. A constant voltage VB1 is applied to the gate of the transistor MN22 and a constant voltage VB2 is applied to a gate of the transistor MN23.

In the conventional operational amplifier, its rising/falling waveform is gradual and its slew rate is low. These problems will be described below in more detail.

When the non-inverting input voltage VIN+ applied to the non-inverting input terminal 30 changes from a normal state, a discharging/charging slew rate (SR1) of the phase compensation capacitor CC is given by Equation 1 below.

$$SR1 = ID2/CC \quad \text{[Equation 1]}$$

where CC represents a static capacitance of the phase compensation capacitor CC, and ID2 represents a bias current flowing through the transistor MN22.

A discharging/charging slew rate (SR2) of the load capacitor CO is given by Equation. 2 below.

$$SR2 = (IO - ID2 - ID3)/CO \quad \text{[Equation 2]}$$

where IO represents a current flowing through the transistor MP22, and ID3 represents a current flowing through the transistor MN23.

In order to improve the slew rate of the operational amplifier shown in FIG. 7, the discharging/charging slew rate (SR1) of the phase compensation capacitor CC and the discharging/charging slew rate (SR2) of the load capacitor CO must be improved. An important point is that a total slew rate is mainly determined by the worse (smaller) one of the two slew rates. When the load capacitor CO such as a liquid crystal driver is relatively small, the improvement of the slew rate (SR1) rather than the slew rate (SR2) is important. At this point, as can be seen from the above equations, the improvement of the slew rate (SR1) needs the current ID2 of the differential amplifier circuit 12.

However, the increase of the current ID2 causes the increase of power consumption according to the flow even in a normal state in which the current ID2 of the differential amplifier circuit 12 is considered as being equal to the non-inverting input voltage (VIN+) and the inverting input voltage (VIN−). Consequently, it is difficult to apply the conventional operational amplifier to a battery-driven mobile device, for example, a portable phone.

SUMMARY OF THE INVENTION

Specific embodiments of the present invention provide an operational amplifier that can remarkably improve a slew rate while suppressing the increase of power consumption.

In accordance with an aspect of the present invention, there is provided an operational amplifier including: a differential amplifier circuit configured to receive an inverting input voltage (VIN−) and a non-inverting input voltage (VIN+); and an auxiliary circuit for improving a slew rate of an output voltage of the differential amplifier circuit, wherein when a voltage difference between the inverting input voltage (VIN−) and the non-inverting input voltage (VIN+) is less than a predetermined small voltage difference, an output terminal of the auxiliary circuit is disconnected from an output terminal of the differential amplifier circuit, and when the voltage difference between the inverting input voltage (VIN−) and the non-inverting input voltage (VIN+) exceeds the predetermined small voltage difference so that a voltage waveform is shifted to at least one direction, the voltage shift is accelerated by receiving/transferring a current from/to the output terminal of the differential amplifier circuit toward a shifting direction of an output voltage of the differential amplifier circuit.

DESCRIPTION OF SPECIFIC EMBODIMENTS

Various embodiments of the present invention are focused on an operational amplifier that can remarkably improve a slew rate while suppressing the increase of power consumption.

Figure 1:
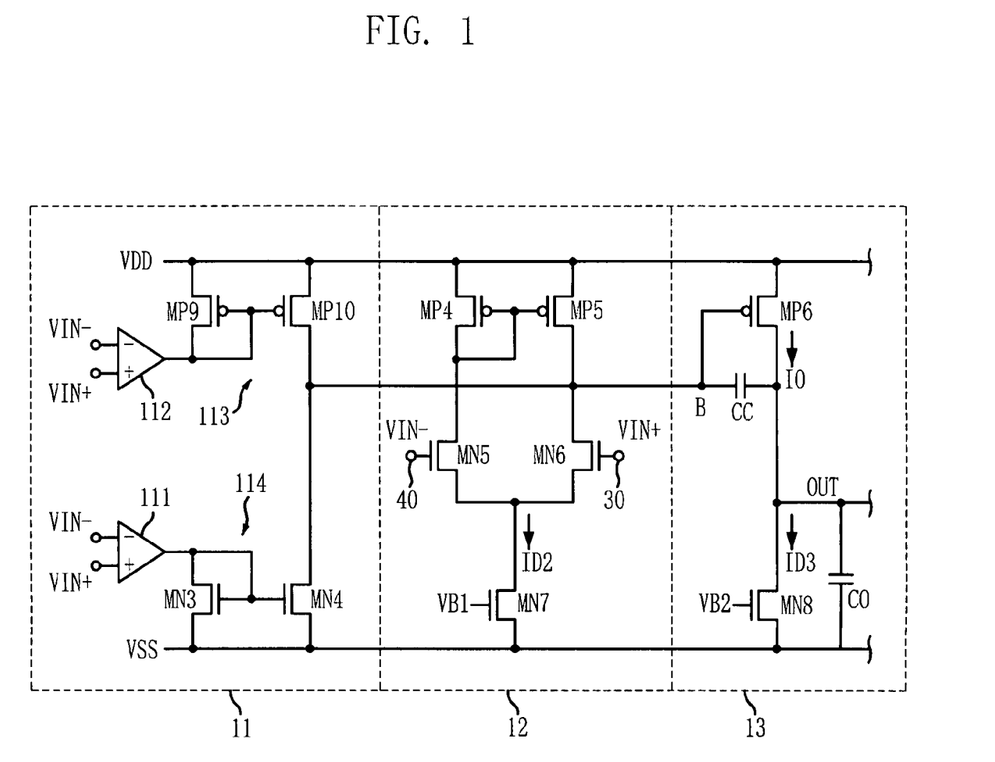
FIG. 1 is a circuit diagram of an operational amplifier in accordance with an embodiment of the present invention.

An operational amplifier in accordance with an embodiment of the present invention will be described below in detail with reference to FIGS. 1 to 3. In FIG. 1, reference symbols MP4, MP5, MP6, MP9 and MP10 represent PMOS transistors and reference symbols MN3 to MN8 represent NMOS transistors. The operational amplifier includes an auxiliary circuit 11, a differential amplifier circuit 12, and an output circuit 13.

The differential amplifier circuit 12 will be described below with reference to FIG. 1. The differential amplifier circuit 12 includes an N-type differential transistor pair with a non-inverting input terminal 30 and an inverting input terminal 40, and transistors MP4 and MP5. The N-type differential transistor pair includes transistors MN5 and MN6. In addition, the differential amplifier circuit 12 includes a P-type current mirror and a constant current source. The P-type current mirror forms a load of the N-type differential transistor pair and the constant current source is implemented with a transistor MN7 to generate a bias current ID2.

More specifically, a drain of the transistor MP4 is connected to a drain of the transistor MN5 and gates of the transistors MP4 and MP5. Sources of the transistors MN5 and MN6 are commonly connected to a drain of the transistor MN7. A drain of the transistor MN6 is connected to a drain of the transistor MP5 and forms an output terminal B of the differential amplifier circuit 12.

The output circuit 13 is an inverter amplifier implemented with a common source transistor MP6 and a transistor MN8, which act as a driver transistor and a constant current load, respectively. A phase compensation capacitor CC is connected between a gate and a drain of the transistor MP6.

More specifically, the drain of the transistor MP6 is connected to a drain of the transistor MN8 and an output terminal OUT of the output circuit 13. The output terminal B of the differential amplifier circuit 12 is connected to the gate of the transistor MP6 and is also coupled to the output terminal OUT of the output circuit 13 through the phase compensation capacitor CC. A load capacitor CO is connected between the output terminal OUT and a ground voltage terminal VSS. The output terminal OUT is connected to the inverting input terminal 40 of the differential amplifier circuit 12, so that an output voltage from the output terminal OUT is applied as an inverting input voltage VIN−. A non-inverting input voltage VIN+ from an external circuit is applied to the non-inverting input terminal 30 of the differential amplifier circuit 12. A constant voltage VB1 is applied to a gate of the transistor MN7 and a constant voltage VB2 is applied to a gate of the transistor MN8. The constant voltage VB1 may be equal to or different from the constant voltage VB2. In addition, the sources of the transistors MP4 to MP6 are connected to a power supply voltage terminal VDD.

The auxiliary circuit 11 includes comparators 111 and 112 and current mirrors 113 and 114. The comparator 111 and the comparator 112 are shown in FIGS. 2 and 3, respectively. In FIG. 2, reference symbols MP1 to MP3 represent PMOS transistors and reference symbols MN1 to MN2 represent NMOS transistors. In FIG. 3, reference symbols MP7 and MP8 represent PMOS transistors and reference symbols MN9 to MN11 represent NMOS transistors.

Figure 2:
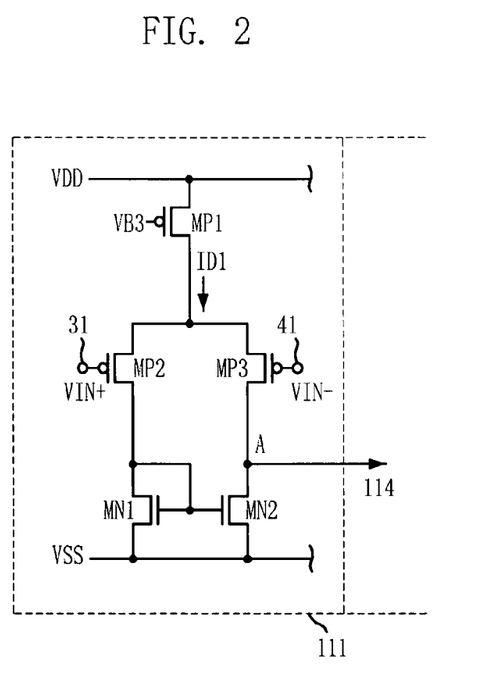
FIG. 2 is a circuit diagram of a comparator shown in FIG. 1.

Referring to FIG. 2, the comparator 111 includes a P-type differential transistor pair with a non-inverting input terminal 31 and an inverting input terminal 41, and transistors MN1 and MN2. The P-type differential transistor pair includes transistors MP2 and MP3. In addition, the comparator 111 includes an N-type current mirror and a constant current source. The N-type current mirror forms a load of the P-type differential transistor pair and the constant current source is implemented with a transistor MP1 to generate a bias current ID1. More specifically, a drain of the transistor MP2 is connected to a drain of the transistor MN1 and gates of the transistors MN1 and MN2. Sources of the transistors MP2 and MP3 are commonly connected to a drain of the transistor MP1. A drain of the transistor MP3 is connected to a drain of the transistor MN2 and forms an output terminal of the comparator 111. A constant voltage VB3 is applied to a gate of the transistor MP1. A source of the transistor MP1 is connected to the positive power supply voltage VDD, and sources of the transistors MN1 and MN2 are connected to the ground voltage VSS. A gate of the transistor MP3, i.e., the inverting input terminal 41 of the P-type differential transistor pair is connected to the output terminal OUT of the output circuit 13, so that the output voltage of the output circuit 13 is applied as an inverting input voltage VIN− to the inverting input terminal 41. A non-inverting input voltage VIN+ from an external circuit is applied to a gate of the transistor MP2, i.e., the non-inverting input terminal 31 of the P-type differential transistor pair.

A W/L ratio defined by a ratio of a gate width to a gate length ratio of the transistor MN2, etc. is set such that a voltage at a node A turns off the transistors MN3 and MN4 of the current mirror 114 when the transistor MN2 is turned on, and turns on the transistors MN3 and MN4 of the current mirror 114 when the transistor MN2 is turned off.

Figure 3:
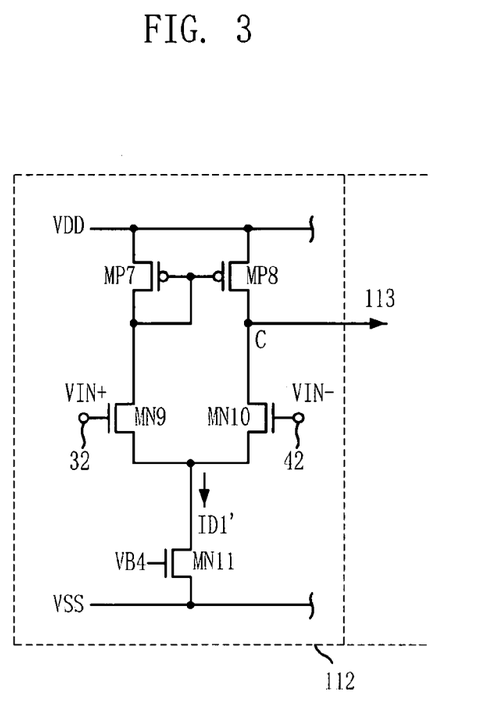
FIG. 3 is a circuit diagram of a comparator shown in FIG. 1.

Referring to FIG. 3, the comparator 112 includes an N-type differential transistor pair with a non-inverting input terminal 32 and an inverting input terminal 42, and transistors MP7 and MN8. The N-type differential transistor pair includes transistors MN7 and MN8. In addition, the comparator 112 includes a P-type current mirror and a constant current source. The P-type current mirror forms a load of the N-type differential transistor pair and the constant current source is implemented with a transistor MN11 to generate a bias current ID1'. More specifically, a drain of the transistor MN9 is connected to a drain of the transistor MP7 and gates of the transistors MP7 and MP8. Sources of the transistors MN9 and MN10 are connected to a drain of the transistor MN11. A drain of the transistor MN10 is connected to a drain of the transistor MP8 and forms an output terminal of the comparator 112. A constant voltage VB4 is applied to a gate of the transistor MN11. A source of the transistor MN11 is connected to the ground voltage VSS, and sources of the transistors MP7 and MP8 are connected to the positive power supply voltage VDD. A gate of the transistor MN10, i.e., the inverting input terminal 42 of the N-type differential transistor pair, is connected to the output terminal OUT of the output circuit 13, so that the output voltage of the output circuit 13 is applied as the inverting input voltage VIN− to the inverting input terminal 42. A non-inverting input voltage VIN+ from an external circuit is applied to a gate of the transistor MN9, i.e., the non-inverting input terminal 32 of the N-type differential transistor pair.

A W/L ratio of the transistor MP8, etc. is set such that a voltage at a node C turns off the transistors MP9 and MP10 of the current mirror 113 when the transistor MP8 is turned on, and turns on the transistors MP9 and MP10 of the current mirror 113 when the transistor MP8 is turned off.

The current mirror 113 is a P-type current mirror implemented with the transistors MP9 and MP10. Specifically, the sources of the transistors MP9 and MP10 are commonly connected to the positive power supply voltage terminal VDD. The gate and drain of the transistor MP9 are connected to the output terminal of the comparator 112, and the drain of the transistor MP10 is connected to the output terminal B of the differential amplifier circuit 12 and the gate of the driver transistor MP6 of the output circuit 13.

The current mirror 114 is an N-type current mirror. implemented with the transistors MN3 and MN4. Specifically, the sources of the transistors MN3 and MN4 are commonly connected to the ground voltage terminal VSS. The gate and drain of the transistor MN3 are connected to the output terminal of the comparator 111, and the drain of the transistor MN4 is connected to the output terminal B of the differential amplifier circuit 12 and the gate of the driver transistor MP6 of the output circuit 13.

In the current mirror 113, the W/L ratio of the transistor MP10 is set to ten times the W/L ratio of the transistor MP9. In the current mirror 114, the W/L ratio of the transistor MN4 is set to ten times the W/L ratio of the transistor MN3.

An operation of the operational amplifier in accordance with the present invention will be described below in detail.

The structure of the operational amplifier can be considered as the combination of the conventional operational amplifier of FIG. 7 and the auxiliary circuit 11.

The operation of the comparator 111 and the current mirror 114 will be described below in detail. In FIG. 2, currents flow through the transistors MP2 and MP3 of the P-type differential transistor pair in a normal state in which a virtual short (an imaginary short) is formed. The virtual short (the imaginary short) is a state in which the inverting input voltage VIN− and the non-inverting input voltage VIN+ are considered as being equal to each other. Consequently, the voltage at the drain of the transistor MN2, i.e., the voltage at the node A, is dropped. Therefore, the transistor MN4 is turned off and the differential amplifier circuit 12 is disconnected from the comparator 111.

Likewise, when the non-inverting input voltage VIN+ is lower than the inverting input voltage VIN− by more than a predetermined small voltage difference ($\Delta V$), the transistor MP3 is cut off and the bias current ID1 from the transistor MP1 flows through the transistors MP2 and MN1. Therefore, the transistor MN2 is turned on so that the voltage at the node A is lowered, and the transistor MN4 of the current mirror 114 is turned off so that the differential amplifier circuit 12 is disconnected from the comparator 111.

On the other hand, when the non-inverting input voltage VIN+ is higher than the inverting input voltage VIN− by more than the predetermined small voltage difference ($\Delta V$), the transistor MP2 is cut off so that no current flows through the transistor MN1. Because the transistor MN2 is turned off, the voltage at the node A rises and the transistors MN3 and MN4 of the current mirror 114 are turned on. Consequently, due to the transistor MP1, the bias current ID1 flows through the transistor MP3, and about ten times of the current ID1 flows through the transistor MN4. This current is added to the bias current ID2 of the differential amplifier circuit 12. If the bias current ID1 is equal to the bias current ID2, the phase compensation capacitor CC is discharged by eleven times the current used in the related art.

That is, only when the non-inverting input voltage VIN+ is higher than the inverting input voltage VIN− by more than the predetermined small current difference ($\Delta V$), the comparator 111 and the N-type current mirror 114 increase the bias current ID2 of the differential amplifier circuit 12 according to each W/L ratio of transistors MN4 and MN3 to accelerate the voltage shift at the output terminal B of the differential amplifier circuit 12. Therefore, the power consumption can be suppressed and the slew rate can be improved in the normal state.

Hereinafter, the operation of the comparator 112 and the current mirror 113 will be described below in detail. In FIG. 3, currents flow through the transistors MN9 and MN10 of the N-type differential transistor pair in the normal state in which the virtual short (the imaginary short) is formed. Consequently, the voltage at the drain of the transistor MP8, i.e., the voltage at the node C, rises. Therefore, the transistor MP10 of the current mirror 113 is turned off and the differential amplifier circuit 12 is disconnected from the comparator 112.

In a similar manner, when the non-inverting input voltage VIN+ is higher than the inverting input voltage VIN− by more than the predetermined small voltage difference ($\Delta V$), the transistor MN10 is cut off and the bias current ID1' from the transistor MN11 flows through the transistors MP7 and MP9. Therefore, the transistor MP8 is turned on so that the voltage at the node C rises, and the transistor MP10 of the current mirror 113 is turned off so that the differential amplifier circuit 12 is disconnected from the comparator 112.

On the other hand, when the non-inverting input voltage VIN+ is lower than the inverting input voltage VIN− by more than the predetermined small voltage difference ($\Delta V$), the transistor MN9 is cut off so that no current flows through the transistor MP7. Because the transistor MP8 is turned off, the voltage at the node C is lowered and the transistors MP9 and MP10 of the current mirror 113 are turned on. Consequently, due to the transistor MN11, the bias current ID1' flows through the transistor MN10, and about ten times of the current ID1' flows through the transistor MP10. This current is added to the bias current ID2 of the differential amplifier circuit 12. If the bias current ID1' is equal to the bias current ID2, the phase compensation capacitor CC is charged by eleven times the current used in the related art.

That is, only when the non-inverting input voltage VIN+ is lower than the inverting input voltage VIN− by more than the predetermined small current difference ($\Delta V$), the comparator 112 and the P-type current mirror 113 increase the bias current ID2 of the differential amplifier circuit 12 according to each W/L ratio of transistors MP10 and MP9 to accelerate the voltage shift at the output terminal B of the differential amplifier circuit 12. Therefore, the power consumption can be suppressed and the slew rate can be improved in the normal state.

In this embodiment, it should be noted that the voltage at the output terminal B of the differential amplifier circuit 12 is inverted by the output circuit 13 acting as the inverter amplifier and then is applied as the inverting input voltage VIN− to the inverting input terminals of the comparators 111 and 112.

As described above, in the normal state in which the voltage difference between the non-inverting input voltage VIN+ and the inverting input voltage VIN− is lower than the predetermined small voltage difference ($\Delta V$), the differential amplifier circuit 12 is disconnected from the comparators 111 and 112 by the current mirrors 113 and 114. Therefore, the current mirrors 113 and 114 are turned off so that the current supply is interrupted.

On the other hand, when the voltage difference between the non-inverting input voltage VIN+ and the inverting input voltage VIN− is higher than the predetermined small voltage difference ($\Delta V$), the differential amplifier circuit 12 is connected to the comparator 111 through the current mirror 114. Consequently, the discharging slew rate (SR1) of the phase compensation capacitor CC becomes (10×ID1+ID2)/CC because a large current (e.g., 10×ID1) increased by the current mirror 114 is added to the bias current ID2 of the differential amplifier circuit 12. That is, the slew rate (SR1) is remarkably improved.

Likewise, when the voltage difference between the non-inverting input voltage VIN+ and the inverting input voltage VIN− is lower than the predetermined small voltage difference (ΔV), the differential amplifier circuit 12 is connected to the comparator 112 through the current mirror 113. Consequently, the charging slew rate (SR1) of the phase compensation capacitor CC becomes (10×ID1'+ID2)/CC because a large current (e.g., 10×ID1') increased by the current mirror 113 is added to the bias current ID2 of the differential amplifier circuit 12. That is, the slew rate (SR1) is remarkably improved.

Figure 4:
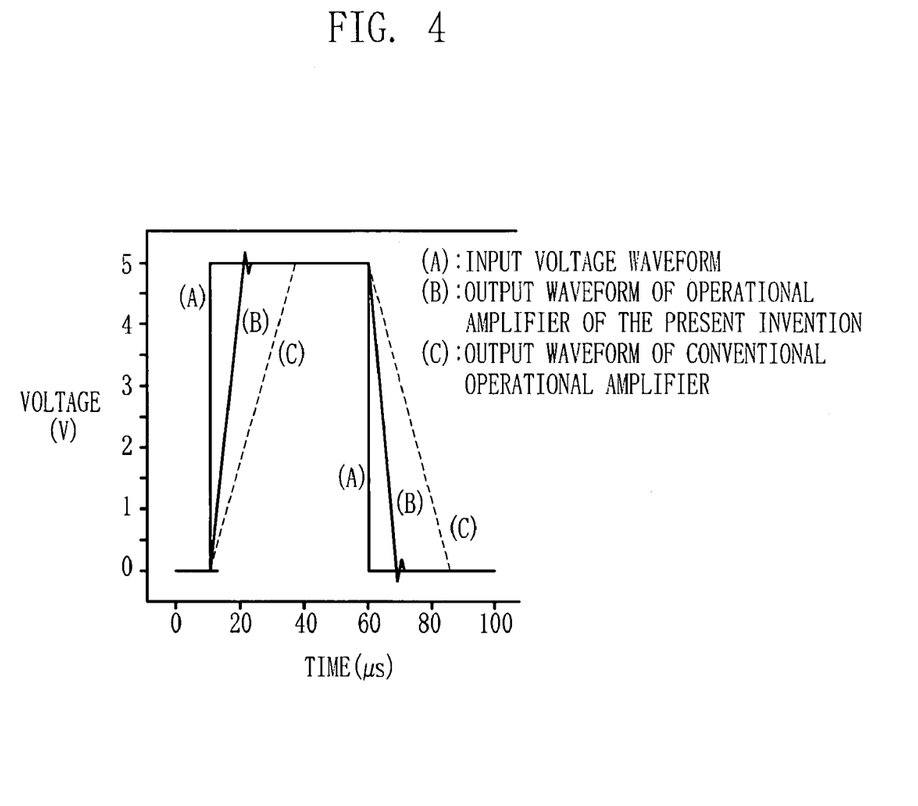
FIG. 4 is input/output voltage waveforms of the operational amplifiers shown in FIGS. 1 and 7.
Figure 5:
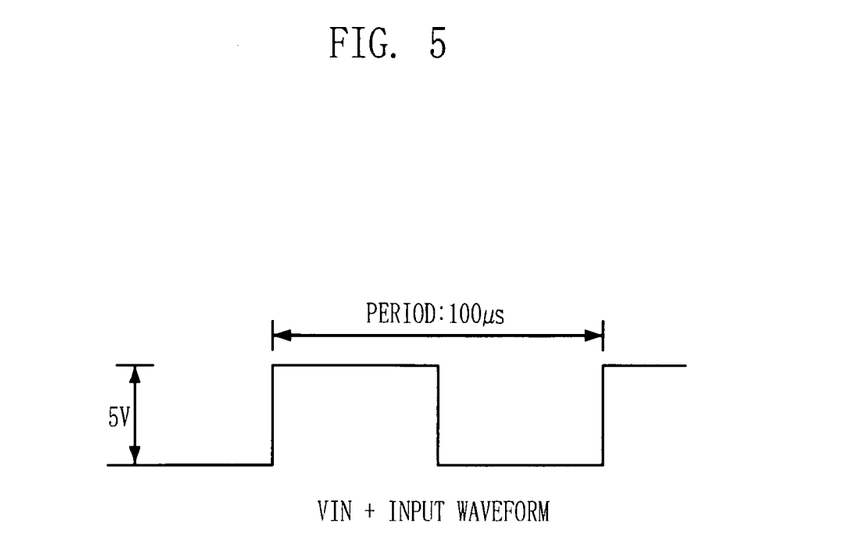
FIG. 5 is a timing diagram of a non-inverting input voltage.

FIG. 4 is a rising/falling waveform of the operational amplifier of FIG. 1 which has the auxiliary circuit 11 and a rising/falling waveform of the operational amplifier of FIG. 7 which has no auxiliary circuit. Specifically, FIG. 4A is a waveform of the non-inverting input voltage VIN+ shown in FIG. 5, FIG. 4B is a waveform of the output voltage from the output terminal OUT of the output circuit 13 shown in FIG. 1, FIG. 4C is a waveform of the output voltage from the output terminal OUT of the output circuit 13 shown in FIG. 7. In FIG. 4, a horizontal axis and a vertical axis represent time and voltage, respectively. It is assumed that the phase compensation capacitor CC and the load capacitor CO are 5 pF and 20 pF, respectively. It can be seen from FIG. 4 that the waveform (slew rate) of the output voltage is remarkably improved in the presence of the auxiliary circuit 11. In this simulation, it is assumed that the currents ID1 and ID1' are 0.2 μA, the current ID2 is 1.0 μA, and the current ID3 is 20 μA. In FIG. 1, the current consumption is 21.4 μA in the normal state in which the non-inverting input voltage VIN+ is substantially equal to the inverting input voltage VIN−.

Referring to FIG. 5, in the operational amplifier of FIG. 1, an average current consumption is 23.1 μA in one period of the input voltage. In the operational amplifier of FIG. 7, an average current consumption is 22.0 μA in one period of the input voltage.

In the above-described embodiment, the operational amplifier is configured with a voltage follower that feeds back the output voltage of the output circuit 13 to the inverting input terminal 40 without using a feedback resistor. However, the operational amplifier can also be configured with a voltage amplifier that feeds back the output voltage of the output circuit 13 to the inverting input terminal 40 through a feedback resistor. In this case, it is necessary to feed back the output voltage to the inverting input terminals 41 and 42 of the comparators 111 and 112 through the feedback resistor.

In addition, the input voltage of the operational amplifier can be inputted to the inverting input terminal, instead of the non-inverting input terminal.

Figure 6:
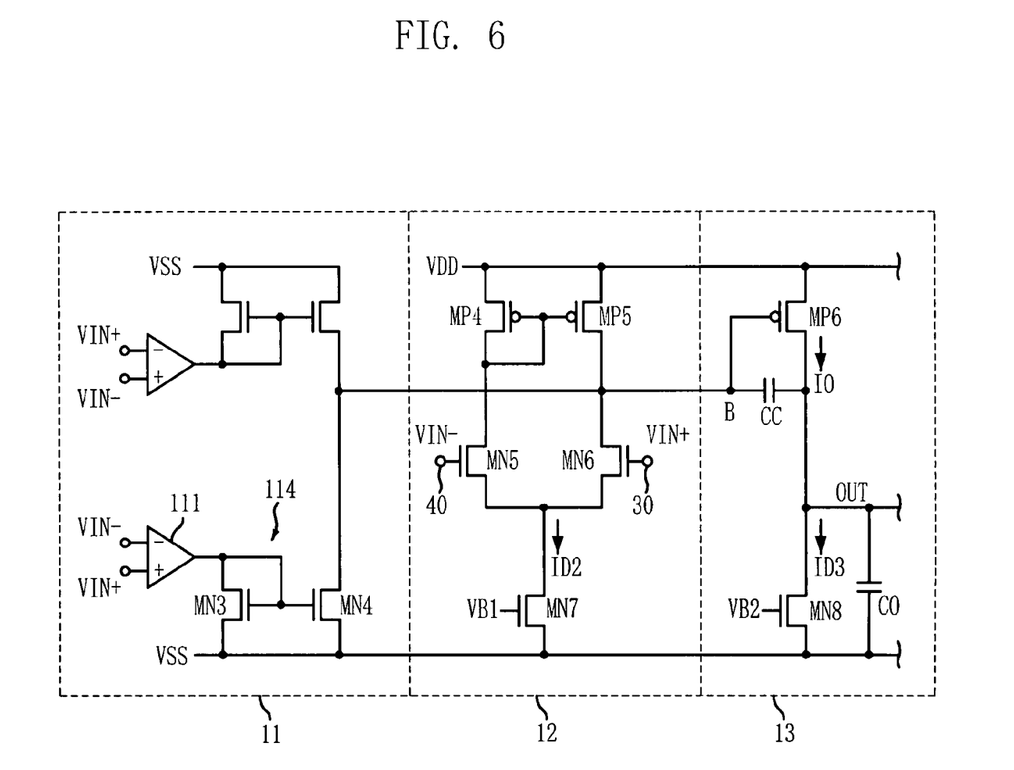
FIG. 6 is a circuit diagram of a modification of the operational amplifier shown in FIG. 1.

Another modification is shown in FIG. 6. In this modification, a pair of the input voltages is reversely inputted to the input terminals of the operational amplifier shown in FIG. 1. At this point, a difference is that the transistors MP7 and MP8 of the comparator 112 and the transistors MP9 and MP10 of the current mirror 113 in FIG. 1 are replaced with NMOS transistors. In this case, the high-speed operation of the operational amplifier can be expected because the use ratio of NMOS transistors is increased.

In addition, the comparators 112 and 113 and the current mirrors 113 and 114 can be replaced with circuits having the equivalent functions.

As described above, the operational amplifier in accordance with the embodiments of the present invention can remarkably improve the slew rate while suppressing the power consumption.

While the present invention has been described with respect to certain preferred embodiments, it will be apparent to those skilled in the art that various changes and modifications may be made without departing from the spirit and scope of the invention as defined in the following claims.

What is claimed is:

1. An operational amplifier, comprising:
    a differential amplifier circuit configured to receive an inverting input voltage (VIN−) and a non-inverting input voltage (VIN+); and
    an auxiliary circuit for improving a slew rate of an output voltage of the differential amplifier circuit,
    wherein when a voltage difference between the inverting input voltage (VIN−) and the non-inverting input voltage (VIN+) is less than a predetermined small voltage difference, an output terminal of the auxiliary circuit is disconnected from an output terminal of the differential amplifier circuit, and when the voltage difference between the inverting input voltage (VIN−) and the non-inverting input voltage (VIN+) exceeds the predetermined small voltage difference so that a voltage waveform is shifted to at least one direction, the voltage shift is accelerated by receiving/transferring a current from/to the output terminal of the differential amplifier circuit toward a shifting direction of an output voltage of the differential amplifier circuit.

2. The operational amplifier as recited in claim 1, wherein the auxiliary circuit includes:
    a comparator configured to receive the inverting input voltage (VIN−) and the non-inverting input voltage (VIN+); and
    a current mirror implemented with a pair of transistors and driven by an output of the comparator, and one of the pair of the transistors that is not connected to the output terminal of the comparator has a drain connected to the output terminal of the differential amplifier circuit.

3. The operational amplifier as recited in claim 2, wherein the comparator includes:
    a differential transistor pair implemented with a pair of transistors of a first conductivity type whose sources are connected to each other, the differential transistor pair having a non-inverting input terminal and an inverting input terminal;
    a constant current source implemented with a transistor of the first conductivity type connected to the sources of the pair of the transistors; and
    a current mirror implemented with a pair of transistors, the current mirror forming a load of the differential transistor pair, the pair of the transistors of the current mirror having a second conductivity type different from the first conductivity type of the differential transistor pair of the comparator.

4. The operational amplifier as recited in claim 1, wherein the auxiliary circuit includes:
    a first comparator;
    a second comparator implemented with transistors having a conductivity type opposite to those of the first comparator;
    a first current mirror circuit driven by the first comparator and connected to a ground voltage terminal (VSS); and
    a second current mirror circuit implemented with transistors having a conductivity type opposite to those of the first current mirror and driven by the second comparator, the second current mirror being connected to a power supply voltage terminal (VDD), output terminals of the first and second current mirror circuits being commonly connected to an output terminal of the differential amplifier circuit.

5. The operational amplifier as recited in claim 4, wherein the first comparator includes:
   a first differential transistor pair implemented with a pair of transistors of a first conductivity type whose sources are connected to each other, the first differential transistor pair having a non-inverting input terminal and an inverting input terminal;
   a first constant current source implemented with a transistor of the first conductivity type connected to the sources of the pair of the transistors; and
   a first current mirror implemented with a pair of transistors, the first current mirror forming a load of the first differential transistor pair, the pair of the transistors of the first current mirror having a second conductivity type different from the first conductivity type of the first differential transistor pair of the comparator.

6. The operational amplifier as recited in claim 5, wherein the second comparator includes:
   a second differential transistor pair implemented with a pair of transistors of the second conductivity type whose sources are connected to each other, the second differential transistor pair having a non-inverting input terminal and an inverting input terminal;
   a second constant current source implemented with a transistor of the second conductivity type connected to the sources of the pair of the transistors; and
   a second current mirror implemented with a pair of transistors, the second current mirror forming a load of the second differential transistor pair, the pair of the transistors of the second current mirror having the first conductivity type.

7. The operational amplifier as recited in claim 1, wherein the auxiliary circuit includes:
   a first comparator configured to receive the inverting input voltage (VIN−) and the non-inverting input voltage (VIN+);
   a first current mirror circuit driven by the first comparator and connected to a ground voltage terminal (VSS);
   a second comparator configured to receive the inverting input voltage (VIN−) and the non-inverting input voltage (VIN+); and
   a second current mirror circuit implemented with transistors having the same conductivity type as those of the first current mirror and driven by the second comparator, the second current mirror being connected to the ground voltage terminal (VSS), output terminals of the first and second current mirror circuits being commonly connected to an output terminal of the differential amplifier circuit.

8. The operational amplifier as recited in claim 7, wherein the first comparator includes:
   a first differential transistor pair implemented with a pair of transistors of a first conductivity type whose sources are connected to each other, the first differential transistor pair having a non-inverting input terminal and an inverting input terminal;
   a first constant current source implemented with a transistor of the first conductivity type connected to the sources of the pair of the transistors; and
   a first current mirror implemented with a pair of transistors, the first current mirror forming a load of the first differential transistor pair, the pair of the transistors of the first current mirror having a second conductivity type different from the first conductivity type of the first differential transistor pair of the comparator.

9. The operational amplifier as recited in claim 8, wherein the second comparator includes:
   a second differential transistor pair implemented with a pair of transistors of the second conductivity type whose sources are connected to each other, the second differential transistor pair having a non-inverting input terminal and an inverting input terminal;
   a second constant current source implemented with a transistor of the second conductivity type connected to the sources of the pair of the transistors; and
   a second current mirror implemented with a pair of transistors, the second current mirror forming a load of the second differential transistor pair, the pair of the transistors of the second current mirror having the second conductivity type.

* * * * *